(12) United States Patent
Yamayoshi

(10) Patent No.: US 7,803,503 B2
(45) Date of Patent: Sep. 28, 2010

(54) HALFTONE MASK AND METHOD FOR MAKING PATTERN SUBSTRATE USING THE HALFTONE MASK

(75) Inventor: Kazushi Yamayoshi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 555 days.

(21) Appl. No.: 11/835,676

(22) Filed: Aug. 8, 2007

(65) Prior Publication Data

US 2008/0107972 A1 May 8, 2008

(30) Foreign Application Priority Data

Nov. 6, 2006 (JP) .............................. 2006-299851

(51) Int. Cl.
*G03F 1/00* (2006.01)
(52) U.S. Cl. ........................................................ 430/5

(58) Field of Classification Search ..................... 430/5, 430/311, 312, 313
See application file for complete search history.

(56) References Cited

U.S. PATENT DOCUMENTS

| 5,811,208 | A  | * | 9/1998  | Yokoyama et al. | ............. 430/5 |
| 6,162,567 | A  |   | 12/2000 | Watanabe |  |
| 6,306,547 | B1 | * | 10/2001 | Kobayashi | ..................... 430/5 |
| 2006/0134531 | A1 | * | 6/2006 | Song et al. | ..................... 430/5 |

FOREIGN PATENT DOCUMENTS

| JP | 2000-75466  | 3/2000  |
| JP | 2003-322949 | 11/2003 |
| JP | 2004-205551 | 7/2004  |

* cited by examiner

*Primary Examiner*—Stephen Rosasco
(74) *Attorney, Agent, or Firm*—Oblon, Spivak, McClelland, Maier & Neustadt, L.L.P.

(57) ABSTRACT

A halftone mask includes translucent film patterns for forming a middle gradation area and light blocking film patterns disposed to an entire periphery of the translucent film patterns.

6 Claims, 3 Drawing Sheets

RELATED ART

HALFTONE MASK AND METHOD FOR MAKING PATTERN SUBSTRATE USING THE HALFTONE MASK

BACKGROUND OF THE INVENTION

1. Field of the Invention

The present invention relates to a halftone mask and a method of manufacturing a pattern substrate using the halftone mask.

2. Description of the Related Art

In a manufacturing process of a liquid crystal display, an optical lithography technology is used to form a pattern on a glass substrate, for example. In the optical lithography, a pattern can be obtained by transferring a pattern of a photomask on the substrate coated with a photosensitive resin (hereinafter referred to as a resist) and developing with an alkali developer.

Usually, for a photomask, a pattern using a light blocking film containing chromium or the like is formed over a transparent substrate. The portion with no pattern is where a light transmits the transparent substrate and exposed to be an exposed area. Furthermore, the portion with the pattern is to be a non-exposed area where light is blocked. Then a pattern corresponding to this area is transferred to a resist. Such photomask is generally referred to as a binary mask.

Conventionally in a TFT array substrate manufacturing process of a liquid crystal display, at least 5 etching processes were required. Different masks are needed to each of the etching processes. Therefore, in the conventional process, 5 masks are required. However in recent years, a technique for reducing the number of photomasks required in manufacture to 4 is advancing. By reducing the number of masks, it is possible to reduce the optical lithography processes. Accordingly, a method for performing 2 different etchings with one mask has been considered. More specifically, by providing a difference in the film thickness of the resist intentionally, different etchings are performed.

To be more specific, firstly 2 different kinds of layers are etched consecutively using a resist mask having thin and thick portions. After that, pre-selected thin portion of the resist is stripped by ashing. At this time, the thick portion of the resist becomes thinner and remains. Then using the remaining resist pattern, an etching is performed along with the shape. After that, the resist is removed. In order to perform an etching in this way, a film thickness difference corresponding to the pattern must be created in advance to the resist. To provide the resist with the film thickness difference, a middle gradation area must be formed. In the middle gradation area, a thin resist pattern is formed. On the other hand, in the non-exposed area, a thick resist pattern is formed.

It is known to use a gray tone mask to form the middle gradation area. The gray tone mask has a pattern arranged in slits or lattice which is not resolved at an optical lithography so as to control the transmitted amount of light in the portion where the pattern is disposed. The gray tone mask is also referred to as a slit mask. Furthermore, in these days, a halftone mask for forming a pattern for the middle gradation area has been developed. Such technique is disclosed in Japanese Unexamined Patent Application Publication No. 2000-075466, 2003-322949 and 2004-205551. The halftone mask is to form the middle gradation area using the translucent mask.

However, as the gray tone mask (slit mask) controls the transmitted amount of light according to intervals between gaps in the pattern, an extremely high controllability is required for measurement of a micropattern. Furthermore, as the position of the micropattern is determined by repeating an optical simulation or actual exposure test, it takes a long time to design. Furthermore, when using a lithography device of a wavelength 365 nm as a light source, the resolution increases. Therefore, a precision is required for measurement control of the micropattern for the gray tone mask.

On the other hand, for a halftone mask, the middle gradation area is formed with a translucent film. Thus controlling a transmittance of the translucent film facilitates middle gradation control. On the other hand, an optical image contrast is insufficient in the boundary between the middle gradation area and exposed area. Therefore, the resist film may be reduced by the development. Moreover, if the optical image contract is insufficient, a lateral inclination angle in the edge portion of the resist pattern in the middle gradation area located in the boundary between the exposed area is reduced in the patterning of the resist by an optical lithography and becomes about 10 degrees, for example. Then the area occupied by the resist lateral inclination portion increases. Therefore, process of the micropattern is more difficult as compared to when the inclination angle is large at a dry etching. That is, with a small resist lateral inclination angle, an etching control is difficult.

SUMMARY OF THE INVENTION

The present invention seeks to solve one or more of the above problems, or to improve upon those problems at least in part and aims to provide a halftone mask for facilitating process shape control at an etching and a method for making a pattern substrate using the halftone mask.

According to an embodiment of the present invention, there is provided a halftone mask that includes a translucent film pattern for forming a middle gradation area and a light blocking film pattern disposed to an entire periphery of the translucent film pattern.

According to another embodiment of the present invention, there is provided a method of manufacturing a pattern substrate for patterning a film provided over a substrate, the method includes exposing a resist over the film by the halftone mask of claim 1, developing the resist exposed by the halftone mask and forming a resist pattern having a film thickness difference and etching the film over the substrate through the resist pattern.

The present invention is able to provide a halftone mask for facilitating a process shape control at an etching and a manufacturing method of a pattern substrate using the halftone mask.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

Figure 1A:
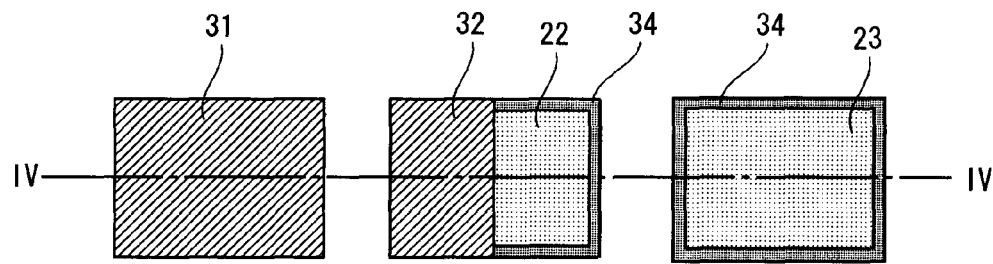
FIG. 1A is a schematic plan view of a halftone mask according to an embodiment of the present invention.
Figure 1B:
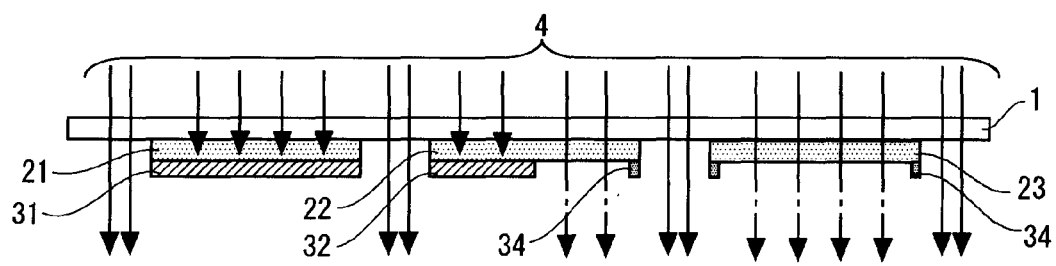
FIG. 1B is a schematic cross-sectional diagram of the halftone mask according to the embodiment of the present invention.
Figure 1C:
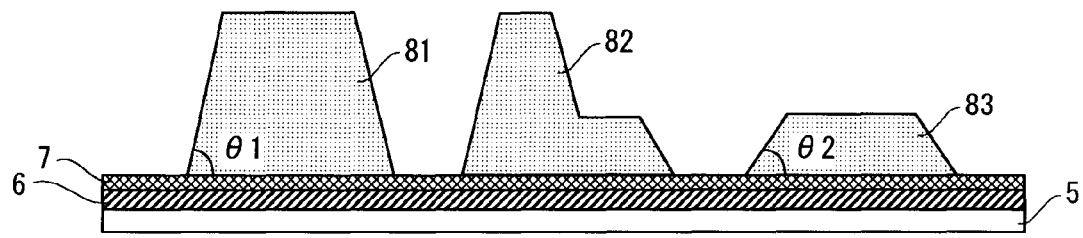
FIG. 1C is a schematic cross-sectional diagram of a resist pattern formed using the halftone mask according to the embodiment of the present invention.

A halftone mask of this embodiment is described hereinafter in detail with reference to FIGS. 1A to 1C. FIGS. 1A to 1C show the halftone mask of this embodiment and a resist pattern formed by the halftone mask. FIG. 1A is a schematic plan view showing the halftone mask according to the embodiment of the present invention and FIG. 1B is a schematic cross-sectional diagram taken along the line IV-IV of FIG. 1A. FIG. 1C is a schematic cross-sectional diagram showing the resist pattern or the like formed using the halftone mask according to the embodiment of the present invention. Here, a resist pattern for patterning films 6 and 7 over a glass substrate 5 is described. Note that in this embodiment, an example is described in which a positive type resist is used, where in the resist, the exposed position disappears by a development and non-exposed position remains.

As shown in FIGS. 1A and 1B, translucent film patterns 21, 22 and 23 and light blocking film patterns 31 and 32 are laminated over a transparent substrate 1. The transparent substrate 1 is, for example, a quartz substrate, and most light of exposure wavelength transmits the transparent substrate 1. Therefore, the area in the transparent substrate 1 where any of the light blocking film patterns 31 and 32 and translucent film patterns 21, 22 and 23 are not formed is to be an exposed area. More specifically, the position where only the transparent substrate 1 exists is to be the exposed area. In the exposed area, a resist is resolved in a developer and disappears.

The light blocking film patterns 31 and 32 blocks the light of the exposure wavelength. Accordingly the area where the light blocking film patterns 31 and 32 are formed is to be a non-exposed area. In the non-exposed area, the resist is not resolved in the developer, thus a thick resist pattern 81 is formed as shown in FIG. 1C. The light blocking film patterns 31 and 32 can be formed by a material containing chromium (Cr), for example.

The translucent film patterns 21, 22 and 23 block a part of the light of the exposure wavelength and form a middle gradation area. That is, the translucent film patterns 21, 22 and 23 have a constant transmittance to the exposure wavelength to transmit a part of the light. Therefore, light exposure of the position where only the translucent film patterns 22 and 23 are formed to the transparent substrate 1 is larger than the light exposure of the position where the light blocking film patterns 31 and 32 are formed and smaller than the light exposure of the position only for the transparent substrate 1. The area where the translucent film patterns 22 and 23 are provided but the light blocking film patterns 31 and 32 are not provided corresponds to the middle gradation area. In the middle gradation area, a part of the resist disappears by the developer. More specifically, a part of the resist in the film thickness direction is resolved in the developer. Therefore in the middle gradation area, a resist pattern 83 having a thinner film thickness than the resist pattern 81 of the non-exposed area is formed.

As described above, the developed resist pattern has a two-stage film thickness. To be more specific, in the non-exposed area, the thick resist pattern 81 is formed and in the middle gradation area, the thin resist pattern 83 is formed. Moreover, in the exposed area, no resist pattern exists. By using the halftone mask in this way, a resist pattern with film thickness difference can be developed. Therefore, the resist pattern has a thick film portion and thin film portion.

Furthermore, the light blocking film pattern 32 includes a micropattern 34 disposed over an edge portion of the translucent film pattern 22. The micropattern 34 is formed with a line width less than the limit of resolution for a lithography device. That is, the micropattern 34 is a pattern not resolved by a lithography device. The micropattern 34 is formed by the same material as the light blocking film pattern 32 to block the light. Moreover, the micropattern 34 is placed over the peripheral portion of the translucent film patterns 22 and 23. Therefore, the light blocking film pattern 32 or micropattern 34 is provided to the entire periphery of the portion to be the middle gradation area. That is, the entire periphery of the translucent film patterns 22 and 23 for forming the middle gradation area is covered with the light blocking film pattern 32 and micropattern 34.

FIGS. 1A and 1B show 3 types of patterns. To the left side of FIGS. 1A and 1B, a pattern for forming the non-exposed area is shown, to the right side, a pattern for forming the middle gradation area is shown and in the center, a pattern for forming the middle gradation area and non-exposed area is shown. Moreover, between each of the patterns, there are portions with no pattern for forming exposed area. By exposing with such halftone mask, the resist patterns 81, 82 and 83 shown in FIG. 1C are formed.

Firstly, the left side pattern of FIGS. 1A and 1B is described hereinafter. To the left side of FIGS. 1A and 1B, the translucent film pattern 21 and light blocking film pattern 31 for forming the rectangle non-exposed area is shown. Over the rectangle translucent film pattern 21, the light blocking film pattern 31 is provided. Here, the translucent pattern 21 and light blocking film pattern 31 having the same shape are overlapped. That is, to the entire translucent pattern 21, the light blocking film pattern 31 is laminated. Accordingly, the translucent film pattern 21 is formed not to run off the light blocking film pattern 31. This creates the rectangle non-exposed area.

Next, the right side pattern of FIGS. 1A and 1B is described hereinafter. To the right side of FIGS. 1A and 1B, the translucent film pattern 23 and micropattern 34 for forming the rectangle middle gradation area is shown. Here, the micropattern 34 is provided to the entire periphery of the rectangle translucent film pattern 23. The micropattern 34 is formed to shape a frame and placed to overlap with the peripheral portion of the translucent film pattern 23. That is, the micropattern 34 shaped to be a frame is formed over the translucent film pattern 23. This creates the rectangle middle gradation area.

Furthermore, the central pattern of FIGS. 1A and 1B is described hereinafter. To the center of FIGS. 1A and 1B, the translucent film pattern 22 and light blocking film pattern 32 are shown for forming the middle gradation area and non-exposed area that are provided to be in contact with each other. That is, by the translucent film 22 and light blocking film pattern 32, the rectangle middle gradation area and rectangle non-exposed are formed to be adjacent. Here, the non-exposed area is disposed to the left side and the middle gradation area is disposed to the right side. Then the non-exposed area and middle gradation area are provided in an integrated manner. In order to form such middle gradation area and non-exposed area, the rectangle translucent film pattern 22 is formed over the transparent substrate 1. The translucent pattern 22 has a shape corresponding to the area added with the middle gradation area and non-exposed area. Furthermore, the light blocking film pattern 32 and micropattern 34 are provided over the translucent film pattern 22. The light blocking film pattern 32 has a shape corresponding to the non-exposed area. Accordingly, the light blocking film pattern 32 is formed to be a rectangle and disposed over the left half of the translucent film pattern 22. The micropattern 34 is disposed over the right side of the translucent pattern 22. As shown in FIG. 1A, the micropattern 34 is disposed to the rightmost and top and bottom edges of the translucent film pattern 22. Therefore, the micropattern 34 is formed to shape a frame with a left side opened. With the micropattern 34 and light blocking film pattern 32, the entire periphery of the translucent film pattern 22 overlaps the light blocking film pattern 32. Thus, the entire periphery of the middle gradation area is surrounded by the light blocking film pattern 32.

As described above, the micropattern 34 is formed with a line width not resolved by a lithography device. Therefore, at an exposure, the micropattern 34 is not transferred to the resist. However the micropattern 34 not transferred to the resist influences the edge portion of the middle gradation area. As the micropattern 34 is formed by the same material as the light blocking film patterns 31 and 32, the light exposure in the edge portion of the middle gradation area is reduced. More specifically, the light exposure is smaller in the edge portion where the micropattern 34 is formed rather than the central portion where the micropattern 34 is not formed for the translucent film pattern 23. This improves a contrast of an optical image in the boundary portion between the middle gradation area and exposed area. That is, the difference between the light exposure in the exposed area and in the edge portion of the middle gradation area increases.

By providing the micropattern 34 in this way, a lateral inclination angle $\theta 2$ in the edge portion of the resist pattern 83 disposed in the middle gradation area can be increased. That is, in the middle gradation area, the rising angle of the resist pattern 83 becomes steeper and the lateral inclination angle $\theta 2$ of the resist pattern 83 increases. Then the area occupied by the lateral inclination portion of the resist pattern 83 can be reduced. This facilitates the control process of the pattern for the film 7 at an etching.

Note that the structure of the halftone mask is not limited to the above structure. For example, the position of the translucent film pattern and light blocking film pattern may be replaced. More specifically, the translucent film pattern may be formed over the light blocking film pattern. At the edge portion of the translucent film pattern, the light blocking film pattern and translucent film pattern may be overlapped. Therefore, the light blocking film pattern may be formed to run off the translucent film pattern.

In this embodiment, to form a resist pattern by an optical lithography, a lithography device (Nikon: FX702J NA=0.145 $\sigma$=0.6) is used. In this case, transmittance for the exposure light of the translucent film pattern is 20 to 40%. This is subject to the performance and process of the resist but the numeric values in which the resist film thickness control in the middle gradation area is relatively stable. Furthermore, the micropattern 34 is preferably a non-resolved pattern for a lithography device so that it is not transferred to the resist at an exposure. The width of the micropattern 34 depends on the resolving power of the lithography device to be used. With a wavelength of 365 nm, the width of the micropattern 34 is 0.5 to 1.0 μm and 0.75 μm is especially preferable.

To form a halftone mask, a mask material for KrF excimer laser (for example HOYA: KrF6% HT mask blanks) is used. After drawing a desired pattern to the mask blanks, the light blocking film patterns 31 and 32 and translucent film patterns 21, 22 and 23 are processed. Furthermore, at the same time as forming the light blocking film patterns 31 and 32, the micropattern 34 is formed. To form these patterns, a conventional method can be used. The micropattern 34 and light blocking film pattern 32 may be formed in the same or different process.

A resist pattern is formed with the manufactured halftone mask. After that, an etching is performed to form a pattern. A series of the patterning method is described hereinafter.

Firstly the formation of the resist pattern is described. Over the glass substrate 5, the films 6 and 7 are formed in this order as films to be etched. Then substantially the entire surface of the glass substrate 5 is covered with the film 6. Moreover, substantially the entire surface of the film 6 is covered with the film 7. Next, a resist is coated over the film 7. Then substantially the entire surface of the film 7 is covered with the resist. At this time, the film thickness of the resist is made to be 1.5 μm. After that, an exposure process is performed using the halftone mask by the FX702J lithography device.

The exposure is performed from the side of the transparent substrate 1. As shown in FIG. 1B, a light transmits the transparent substrate 1 and translucent film pattern in this order and irradiated to the resist. Then the resist is developed using a developer. At this time, a part of the resist is developed and becomes the state of FIG. 1C. In the exposed area, the resist disappears by the developer. In the non-exposed area, as the resist is not resolved in the developer, the resist remains with the thick film. In the non-exposed area, the film thickness of the resist does not change. Therefore, the film thickness of the resist pattern remains to be 1.5 μm. In the middle gradation area, as a part of the resist disappears, the film thickness remains with the thin film. In the middle gradation area, the resist film is reduced according to the amount of light for the transmittance of the translucent film pattern and the thinner resist pattern 83 than the resist pattern 81 is formed. The film thickness of the resist pattern 83 in the middle gradation area is almost half of the film thickness of the resist pattern 81 in the non-exposed area. The film thickness of the resist pattern 83 is 0.4 to 0.8 μm and preferably 0.6 μm. The film thickness control changes according to the light exposure of the light source 4.

As shown in FIG. 1, the lateral inclination angle $\theta 2$ in the edge portion of the resist pattern 83 in the middle gradation area is preferably 30 to 50 degrees and approx. 40 degrees is especially preferable. The angle $\theta$ changes according to the light exposure and film thickness of the resist pattern 83. On the other hand, the lateral inclination angle $\theta 1$ in the edge portion of the resist pattern 81 in the non-exposed area is approx. 70 degrees. Thus the relationship of $\theta 1 > \theta 2$ is satisfied.

Figure 2A:
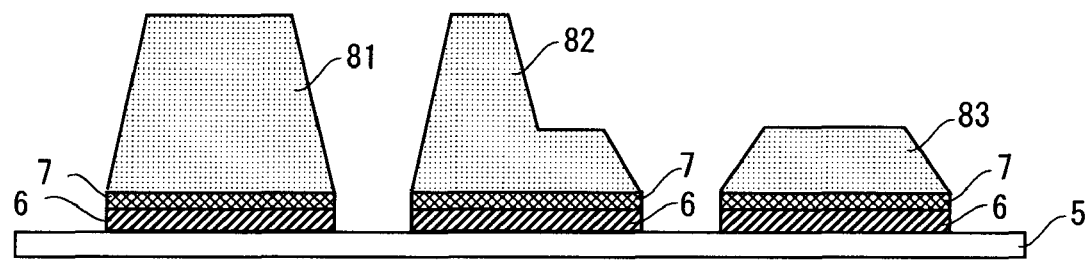
FIG. 2A is a schematic cross-sectional diagram of an etching method using the resist pattern formed using the halftone mask according to the embodiment of the present invention.
Figure 2B:
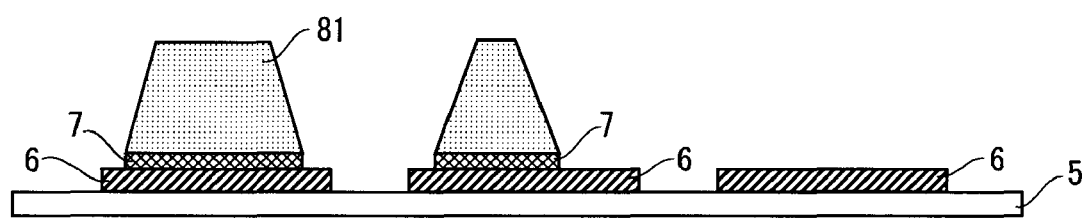
FIG. 2B is a schematic cross-sectional diagram of an etching method using the resist pattern formed using the halftone mask according to the embodiment of the present invention.

Next, an etching is performed with the resist patterns 81, 82 and 83 as masks. Here, a continuous etching for etching the films 7 and 6 at a time is performed. When using a dry etching, as the films have etching shapes corresponding to the resist lateral inclination, it is preferable to increase $\theta 1$ and $\theta 2$. More specifically, as shown in FIG. 1C, if $\theta 1$ and $\theta 2$ are large, variation in the amount of recession of the resist by a dry etching can be reduced. Therefore an etching control is facilitated. That is, by increasing $\theta 1$ and $\theta 2$, measurement control and lateral control of the etching can be performed easily. As shown in FIG. 2A, by the continuous etching, the films 6 and 7 are processed in substantially the same pattern shape. FIGS. 2A and 2B are cross-sectional diagrams showing the structure of the glass substrate 5 when etching using the resist pattern shown in FIG. 1C. As described above, in the exposed area, the films 6 and 7 are etched and the glass substrate is exposed.

Next, an ashing process is performed so that the resist pattern 83 in the middle gradation area completely disappears. Then the resist of the thin film portion where the resist film thickness was thin immediately after the development is removed and the film 7 in the middle gradation area is exposed. By this ashing process, the resist pattern 81 in the non-exposed area recesses. Thus even in the position where the resist pattern 81 is recessed, the film 7 is exposed. In the non-exposed area, the film thickness is thick enough as compared to the middle gradation area, most of the resist pattern 81 remains. More specifically, even after removing the resist pattern 83 with thin film thickness by an ashing, in the thick film portion where the thickness of the resist film is thick immediately after the development, the resist pattern 81 becomes thin and remains. Here, as described above, the lateral inclination angle θ1 for the resist in the non-exposed area is larger than the lateral inclination angle θ2 in the middle gradation area. Thus negative effects caused by the recession of the resist due to the ashing process can be reduced. Therefore, even when the resist pattern recesses by the ashing, as the lateral inclination angle θ1 is large, it is possible to suppress variations in the process control of the pattern. Therefore, it is possible to pattern accurately.

After performing an ashing process as described above, a second etching is performed as shown in FIG. 2B to remove the film 7. Here, only the film 7 is removed by a dry etching so as to expose a part of the film 6. That is, the film 6 is exposed in the middle gradation area. Furthermore, in the edge portion of the non-exposed area, even in the position where the resist pattern 81 is recessed, the film 6 is exposed.

As described above, by performing 2 etching processes, the pattern shown in FIG. 2B is formed over the glass substrate 5. To the left side of FIG. 2B corresponding to the non-exposed area, the pattern including the laminated films 6 and 7 is shown. Moreover, in the laminated pattern of the left side of FIG. 2B, the film 7 is smaller than the film 6 for the amount of recession in the resist pattern at the ashing. Therefore, the edge portion of the film 6 is exposed from the film 7. To the right side of FIG. 2B corresponding to the middle gradation area, only the film 7 is removed and film 6 is provided. More specifically, the film 7 is etched so that the film 6 is exposed. In the center of FIG. 2B corresponding to the non-exposed area and middle gradation area, the pattern including the laminated films 6 and 7 is shown. Furthermore, for the laminated pattern, in the middle gradation area, the film 7 is removed and the film 6 is exposed. In the non-exposed area, the films 7 and 6 are laminated. In the laminated pattern corresponding to the non-exposed area, the film 7 is smaller than the film 6 for the amount of recession in the resist pattern at the ashing. Therefore, the edge portion of the film 6 is exposed from the film 7.

After that, all the resist is removed by an ashing process or stripping process. This removes the resist patter 81 in the non-exposed area. Specifically, immediately after the development, the resist pattern of the thick film portion is removed. As described above, the films 6 and 7, which are two types of films to be etched, are etched two times. Here, a film thickness difference is provided to the resist pattern using the halftone mask. Then the laminated films 6 and 7 can be processed in different pattern shapes. By using the halftone mask of this embodiment, the lateral inclination angles θ1 and θ2 can be increased. Thus the process shape control at an etching can be easily carried out and can be patterned accurately. Moreover, in the above explanation, a dry etching is used but it may be a wet etching. Furthermore, the films 6 and 7 may be conductive films such as metal or transparent conductive films or semiconductor films such as silicon films. The films 6 and 7 may be insulating films.

As described above, in the patterning method using the halftone mask, a resist film thickness difference can be provided deliberately in one optical lithography process. With the resist pattern having a film thickness difference, 2 types of films to be etched are etched with different shapes. That is, an etching process is performed before and after the ashing to the resist pattern having a film thickness difference. This enables to process the films 6 and 7 in different shapes. Furthermore, in the halftone mask of this embodiment, the micropattern 34 is disposed in the periphery of the translucent film pattern. By this, the optical image contrast in the boundary portion between the middle gradation area and exposed area can be emphasized. Thus, even if the resist film is reduced by the development, the resist lateral inclination angle θ2 in the middle gradation area can be retained. Therefore, the process shape control at a dry etching is facilitated.

The pattern substrate manufactured by the above halftone mask can be used for a TFT array substrate and a substrate for display device. Thus the productivity for the pattern substrate of the TFT array substrate and display device can be improved.

Comparative Example

Figure 3A:
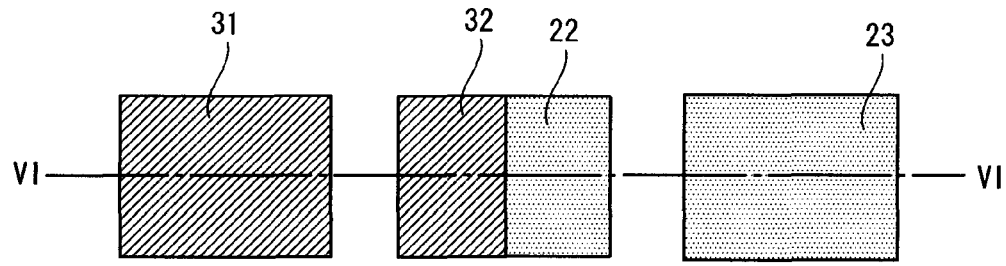
FIG. 3A is a schematic plan view of a conventional halftone mask with no micropattern in a middle gradation area.
Figure 3B:
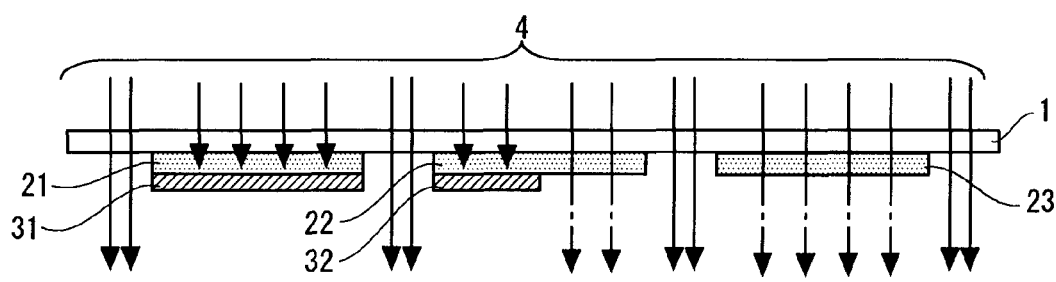
FIG. 3B is a schematic cross-sectional diagram of a conventional halftone mask with no micropattern in a middle gradation area.
Figure 3C:
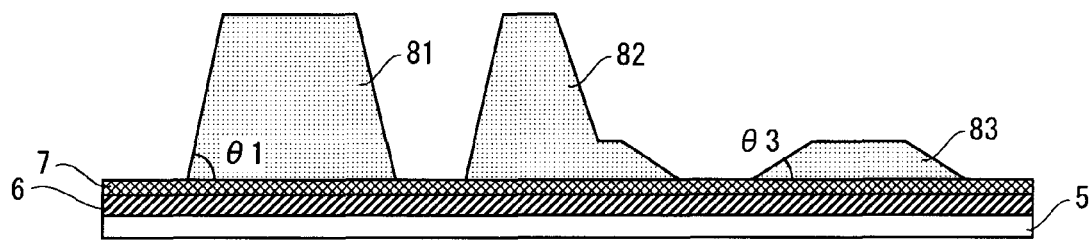
FIG. 3C is a schematic cross-sectional diagram of a resist pattern formed using a conventional halftone mask.

FIGS. 3A to 3C are schematic plan view and cross-sectional diagram of a conventional halftone mask not including the micropattern 34 in the middle gradation area and a resist pattern formed using the halftone mask. FIG. 3A is a schematic plan view of a conventional halftone mask and FIG. 3B is a schematic cross-sectional diagram taken along the line VI-VI of FIG. 3A. FIG. 3C is a schematic cross-sectional diagram of a resist pattern or the like created by exposing with the halftone mask. The resist lateral inclination angle θ3 in the middle gradation area when the micropattern 34 is not disposed is about 10 degrees, which is considerably smaller than θ2 when disposing the micropattern 34. If the resist lateral inclination angle θ3 in the middle gradation area is small as described above, the recession of the resist may increase during an etching. In such case, bad effects such as a measurement control and lateral control of the etching are likely to be generated.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A halftone mask comprising:
   a translucent film pattern for forming a middle gradation area; and
   a light blocking film pattern disposed to an entire periphery of the translucent film pattern, at least one portion of the light blocking film pattern including a micropattern formed with a line width smaller than a resolution of a lithography device to block a higher amount of light transmitted from the lithography device than a portion of the light blocking film pattern not including the micropattern.

2. The halftone mask according to claim 1, wherein the light blocking film pattern includes chromium.

3. The halftone mask according to claim 1, wherein the width of the micropattern is 0.5 to 1.0 μm.

4. The halftone mask according to claim 1, wherein a transmittance of the translucent film pattern is 20 to 40%.

5. A method of manufacturing a pattern substrate for patterning a film provided over a substrate, the method comprising:
    exposing a resist over the film by the halftone mask of claim 1;
    developing the resist exposed by the halftone mask and forming a resist pattern having a film thickness difference; and
    etching the film over the substrate through the resist pattern.

6. The method according to claim 5, further comprising:
    forming a lateral inclination angle of the resist in a thin film portion of the resist pattern having the film thickness difference, the lateral inclination angle ranging between 30 to 50 degrees; and
    making a lateral inclination angle of the resist in a thick film portion of the resist having the film thickness difference larger than the lateral inclination angle of the resist in the thin film portion to develop the resist.

* * * * *